(12) United States Patent
van den Heuvel et al.

(10) Patent No.: US 11,424,747 B2
(45) Date of Patent: Aug. 23, 2022

(54) SYSTEMS AND METHODS FOR ALL-DIGITAL PHASE LOCKED LOOP

(71) Applicant: Stichting IMEC Nederland, Eindhoven (NL)

(72) Inventors: Johan van den Heuvel, Geldrop (NL); Elbert Bechthum, Veldhoven (NL)

(73) Assignee: Stichting Imec Nederland, Eindhoven (NL)

( * ) Notice: Subject to any disclaimer, the term of this patent is extended or adjusted under 35 U.S.C. 154(b) by 0 days.

(21) Appl. No.: 17/159,124

(22) Filed: Jan. 26, 2021

(65) Prior Publication Data
US 2021/0234547 A1   Jul. 29, 2021

(30) Foreign Application Priority Data
Jan. 27, 2020 (EP) .................... 20153770

(51) Int. Cl.
*H03D 3/24* (2006.01)
*H03L 7/093* (2006.01)
*H04L 7/033* (2006.01)

(52) U.S. Cl.
CPC ............ *H03L 7/093* (2013.01); *H04L 7/0331* (2013.01); *H03L 2207/50* (2013.01)

(58) Field of Classification Search
CPC ..... H03L 7/093; H03L 7/099; H03L 2207/50; H04L 7/0331; G06F 9/4812
USPC .................................. 375/373–376, 295, 316
See application file for complete search history.

(56) References Cited

U.S. PATENT DOCUMENTS

| | | | |
|---|---|---|---|
| 6,107,843 A | 8/2000 | de Gouy et al. | |
| 2007/0188244 A1* | 8/2007 | Waheed | H03L 7/099 331/16 |
| 2008/0192876 A1 | 8/2008 | Dulger et al. | |
| 2009/0153255 A1 | 6/2009 | Chiu et al. | |
| 2009/0279594 A1* | 11/2009 | Muhammad | G06F 9/4812 375/219 |
| 2010/0277360 A1 | 11/2010 | Lee | |
| 2013/0214837 A1 | 8/2013 | Turner et al. | |
| 2016/0173111 A1 | 6/2016 | Cali et al. | |

OTHER PUBLICATIONS

Extended European Search Report and Written Opinion, EP Application No. 20153770.1, dated Jul. 24, 2020, 8 pages.

(Continued)

*Primary Examiner* — Phuong Phu
(74) *Attorney, Agent, or Firm* — McDonnell Boehnen Hulbert & Berghoff LLP

(57) ABSTRACT

An all-digital phase locked loop (ADPLL) is provided. The ADPLL comprises a pattern generator adapted to generate a frequency control word (FCW) based on a predefined setting and a system clock. In addition, the ADPLL comprises a phase accumulator adapted to translate the FCW into a phase trajectory. The ADPLL further comprises a phase comparator adapted to generate a phase error signal representing a difference between the phase trajectory and the phase of an output oscillation frequency. Moreover, the ADPLL comprises a controller adapted to control a phase of the output oscillation frequency with respect to the phase trajectory.

19 Claims, 8 Drawing Sheets

(56) References Cited

OTHER PUBLICATIONS

McMahill, Daniel R., and Charles G. Sodini. "A 2.5-Mb/s GFSK 5.0-Mb/s 4-FSK automatically calibrated/spl Sigmal/-/splDelta/ frequency synthesizer." IEEE Journal of Solid-State Circuits 37, No. 1 (2002): 18-26.

Zhan, Mingzhou, Xiaoqiang Xie, Hongfei Yao, Ruimin Xu, and Weigan Lin. "A novel full phase-coherent frequency synthesis method for SFWF radar application." IEEE transactions on microwave theory and techniques 59, No. 7 (2011): 1840-1845.

Zand, Pouria, Jac Romme, Jochem Govers, Frank Pasveer, and Guido Dolmans. "A high-accuracy phase-based ranging solution with Bluetooth Low Energy (BLE)." In 2019 IEEE Wireless Communications and Networking Conference (WCNC), pp. 1-8. IEEE, 2019.

* cited by examiner

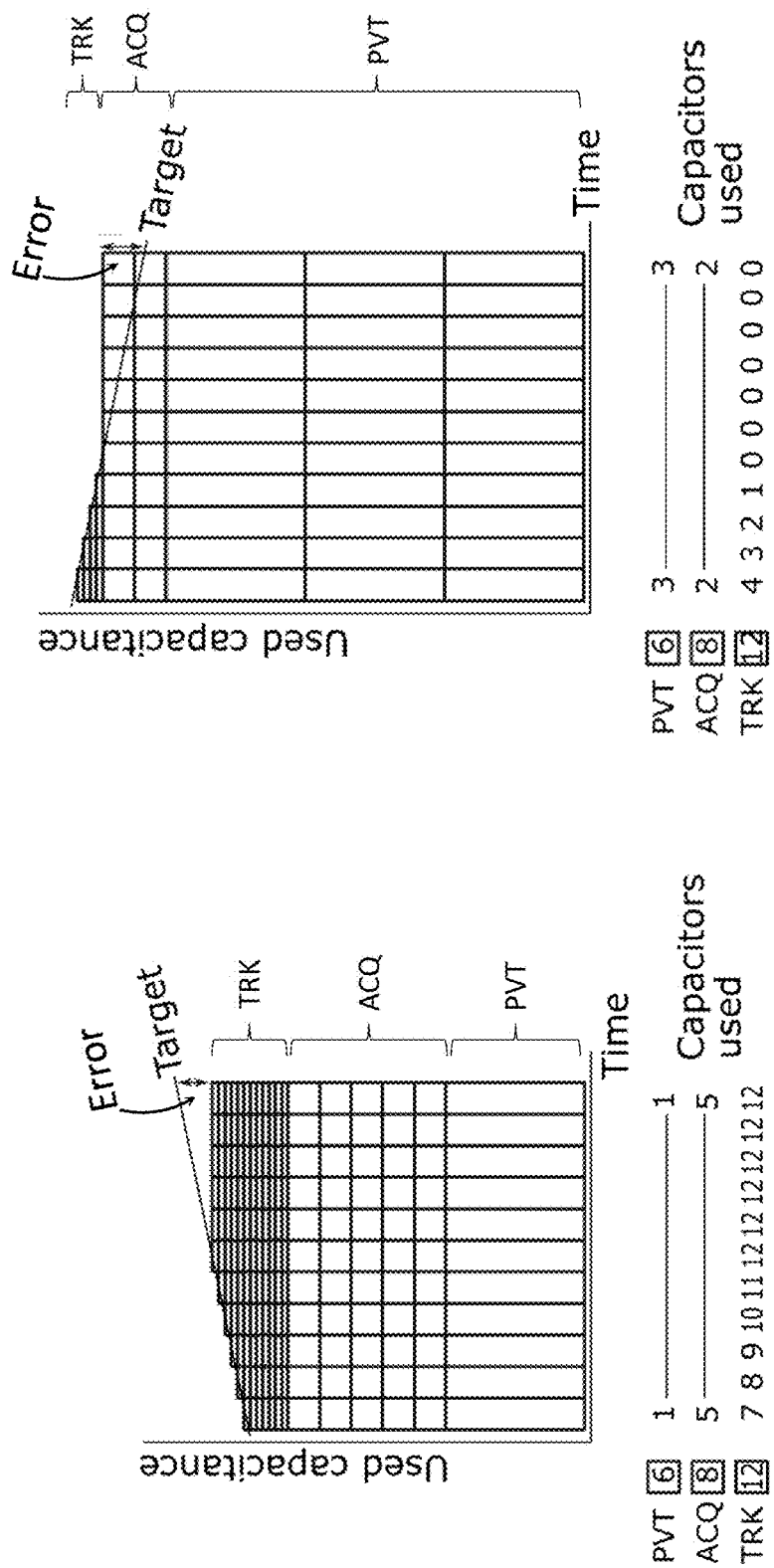

SYSTEMS AND METHODS FOR ALL-DIGITAL PHASE LOCKED LOOP

CROSS-REFERENCE TO RELATED APPLICATIONS

The present application is a non-provisional patent application claiming priority to European Patent Application No. EP 20153770.1, filed Jan. 27, 2020, the contents of which are hereby incorporated by reference.

FIELD OF THE DISCLOSURE

The disclosure relates to coherent multi-carrier phase based ranging, especially for measuring the propagation delay or distance between two communicating radios by using the phase difference in a ranging application.

BACKGROUND

Currently, applications utilizing narrow-band radios for range estimations are gaining traction. By exchanging information about the radio channel between the over multiple channels, e.g., channel state information, the narrow-band radios can build up a virtual-wideband ranging system. The concatenation of narrow-band channels to virtual-wideband makes it possible for half-duplex low power radios to achieve a very high ranging accuracy.

For example, Pouria Zand, et al., "A high-accuracy phase-based ranging solution with Bluetooth Low Energy (BLE)", 2019 IEEE Wireless Communications and Networking Conference (WCNC), Morocco, Apr. 2019, pp. 1-8; discloses narrow-band ranging in BLE environment. The document especially shows that half-duplex Bluetooth low power radios operating in the Industrial, Scientific and Medical (ISM) radio bands can achieve ranging accuracies of 30 cm or better. However, due to multipath in non-line of sight channels, ambiguity in the virtual-wideband channel phase state information occurs when channels are concatenated.

In order to remove ambiguity on the channel phase state information, it is desirable to have phase coherent measurements over multiple channels as this vastly reduces the number of unknown parameters needed to be estimated. Phase-coherency of the ranging procedure entails hat both radios, especially both digital phase-locked loops (PLLs) respecting the radios, stay phase-coherent throughout the channel switching of the whole ranging procedure. The phase-coherency referred herein is not limited to maintaining the same phase of the PLL when switching back and forth through different frequencies. The disclosure is moreover targeting to achieve a predictable phase relationship over one or multiple frequency changes of the PLL, which does not necessarily require that the phase is the same when switching to a different frequency and back.

SUMMARY

Accordingly, an aspect of the present disclosure is to provide an all-digital phase locked loop (ADPLL) and a method for coherent multi-carrier phase based ranging, which can achieve a predictable phase relationship over one or multiple frequency changes of the ADPLL.

The aspect is solved by the features of the first independent claim for the ADPLL and by the features of the second independent claim for the method. The dependent claims contain further developments.

According to a first aspect of the disclosure, an all-digital phase locked loop (ADPLL) is provided. The ADPLL comprises a pattern generator adapted to generate a frequency control word (FCW) based on a predefined setting and a system clock. Additionally, the ADPLL comprises a phase accumulator adapted to translate the FCW into a phase trajectory. Furthermore, the ADPLL comprises a phase comparator adapted to generate a phase error signal representing a difference between the phase trajectory and the phase of an output oscillation frequency. Moreover, the ADPLL comprises a controller adapted to control a phase of the output oscillation frequency with respect to the phase trajectory.

In this context, the ADPLL can further comprises a loop filter adapted to generate control signals towards the controller based on the phase error signal. The output oscillation frequency is generated by a digitally controlled oscillator (DCO) within the ADPLL, where the DCO output is fed back to the phase comparator, thereby generating the phase error signal with respect to the phase trajectory translated from the FCW.

Therefore, the present disclosure allows for coherent phase based ranging in ranging applications by providing a predictable phase trajectory that is followed by the ADPLL. The pattern generator generates the FCW based on its settings and the system clock. The system clock can be predictable and stable, and hence the FCW pattern can be programmed accurately. The output of the pattern generator, i.e., the pattern of the FCW can be, for instance, a staircase, a stepped pyramid, a linear frequency sweep, a frequency hopping pattern, etc. The FCW is then unambiguously translated into the phase trajectory, for instance, by an FM to PM translation.

In addition, the loop filter is further adapted to receive a modulating signal through a direct path, whereby the modulating signal is either generated by the pattern generator or calculated from the phase trajectory. Hence, the proposed ADPLL facilitates a two-point modulation scheme utilizes the wideband frequency modulation capability by adjusting its digital FCW. The implemented modulation scheme is a digital two-point scheme with one modulating point, e.g., at the input of the phase accumulator, compensating for the developed excess phase error while the other modulating point, e.g., at the output of the loop filter, directly modulating the DCO frequency deviation.

According to a first example embodiment of the first aspect of the disclosure, the controller comprises a Process-Voltage-Temperature (PVT) capacitor bank, an Acquisition (ACQ) capacitor bank and a Tracking (TRK) capacitor bank. In this context, the controller is adapted to exchange capacitance between the PVT capacitor bank and the ACQ capacitor bank, and between the ACQ capacitor bank and the TRK capacitor bank in order to increase their effective range. The controller comprises the DCO control banks, i.e., a large PVT capacitor bank, a medium-sized ACQ capacitor bank and a fine TRK capacitor bank. By exchanging capacitance between the large PVT capacitor bank, the medium-sized ACQ capacitor bank and the fine TRK capacitor bank, i.e., by exchanging control codes over the DCO control banks, a phase lock for the ADPLL is maintained over the entire ISM band sweep without a relock. This increases the useful range without adding additional hardware in the DCO.

According to a second example embodiment of the first aspect of the disclosure, the phase trajectory translated from the FCW is predictable in both timing and amplitude over a number of channels to be measured. In some embodiments, a more accurate narrow-band ranging can be achieved.

According to a further example embodiment of the first aspect of the disclosure, the phase accumulator is further adapted to receive a relock command in order to relock the ADPLL to the phase trajectory when switching over the number of channels to be measured. In some embodiments, the ADPLL can be forced to lock to the desired programmed phase trajectory over multiple separate locks of the ADPLL. Hence, after changing the FCW for changing the channel, the relock command forces the ADPLL to relock to the phase trajectory.

According to a further example embodiment of the first aspect of the disclosure, the controller further comprises a modulation bank respecting the frequency span of the number of channels to be measured. Therefore, in addition to the existing DCO control banks or as an alternative, a dedicated DCO control bank can be utilized that spans all relevant RF channels in order to force the ADPLL to follow the programmed phase trajectory.

According to a further example embodiment of the first aspect of the disclosure, the phase accumulator further comprises a first phase accumulator and a second phase accumulator respectively operable on a transmit mode and a receive mode or vice versa. In example embodiments, the present disclosure is applicable even for radio architectures where the frequency of the ADPLL is different between receive mode and transmit mode, e.g., low-IF and sliding-IF receivers.

According to a further example embodiment of the first aspect of the disclosure, the phase accumulator further comprises a compensation unit adapted to calculate a respective phase trajectory for a transmit mode and/or a receive mode. Therefore, it is further possible to implement the proposed solution for different ADPLL frequency between receive mode and transmit mode by having a phase accumulator dedicated to one mode (transmit/receive) and by calculating the phase trajectory for the other mode (receive/transmit).

According to a second aspect of the disclosure, a wireless communication system is provided. The system comprises a first radio node and a second radio node, where each node comprises an ADPLL according to the first aspect of the disclosure. In this context, the first radio node is operable on a transmit mode and the second radio node is operable on a receive mode or vice versa. In addition, the first radio node and the second radio node are adapted to switch between the transmit mode and the receive mode through a number of channels to be measured in order to measure a phase at each channel. Since both ADPLLs follow the predictable phase trajectory, both ADPLLs stay phase-coherent throughout the channel switching for the whole ranging procedure.

According to a third aspect of the disclosure, a method is provided for maintaining phase lock of an all-digital phase locked loop (ADPLL) along a predictable phase trajectory. The method comprises the step of generating a frequency control word (FCW) by a pattern generator based on a predefined setting and a system clock. The method additionally comprises the step of translating the FCW into a phase trajectory by a phase accumulator. Furthermore, the method comprises the step of generating a phase error signal by a phase comparator representing a difference between the phase trajectory and the phase of an output oscillation frequency.

Moreover, the method comprises the step of controlling a phase of the output oscillation frequency by a controller with respect to the phase trajectory. In this context, the method can further comprise the step of generating control signals by a loop filter towards the controller based on the phase error signal. In addition, the method further comprises the step of receiving a modulating signal by the loop filter through a direct path, whereby the modulating signal is either generated by the pattern generator or calculated from the phase trajectory. Hence, the proposed solution allows for coherent phase based ranging in ranging applications by providing a predictable phase trajectory that is followed by the ADPLL.

According to a first example embodiment of the third aspect of the disclosure, the controller comprises a Process-Voltage-Temperature (PVT) capacitor bank, an Acquisition (ACQ) capacitor bank and a Tracking (TRK) capacitor bank. In this regard, the method further comprises the step of exchanging capacitance between the PVT capacitor bank and the ACQ capacitor bank, and between the ACQ capacitor bank and the TRK capacitor bank by the controller, thereby increasing their effective range. In some embodiments, the useful range for ranging measurement is significantly increased without adding additional hardware in the DCO.

According to a second example embodiment of the third aspect of the disclosure, the method further comprises the step of setting the phase comparator output to zero while exchanging capacitance in order to maintain a phase lock during the capacitance exchange. Therefore, the capacitance exchange is performed in a continuously on mode for the ADPLL. The ADPLL is put on hold by fixing the phase comparator output to zero for clock cycles where the capacitance exchange is performed, which further eliminates any analog switching spikes in the DCO.

According to a further example embodiment of the third aspect of the disclosure, the method further comprises the step of translating the phase trajectory from the FCW in a predictable manner in both timing and amplitude over a number of channels to be measured. Hence, a faster and more accurate narrow-band ranging can be achieved.

BRIEF DESCRIPTION OF THE FIGURES

The above, as well as additional, features will be better understood through the following illustrative and non-limiting detailed description of example embodiments, with reference to the appended drawings.

FIG. 3A shows a traditional capacitance allocation scheme with increasing target frequency by way of an example;

FIG. 3B shows a traditional capacitance allocation scheme with decreasing target frequency by way of an example;

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Reference will now be made in detail to the embodiments of the present disclosure, examples of which are illustrated in the accompanying drawings. However, the following embodiments of the present disclosure may be variously modified and the range of the present disclosure is not limited by the following embodiments.

Figure 1:
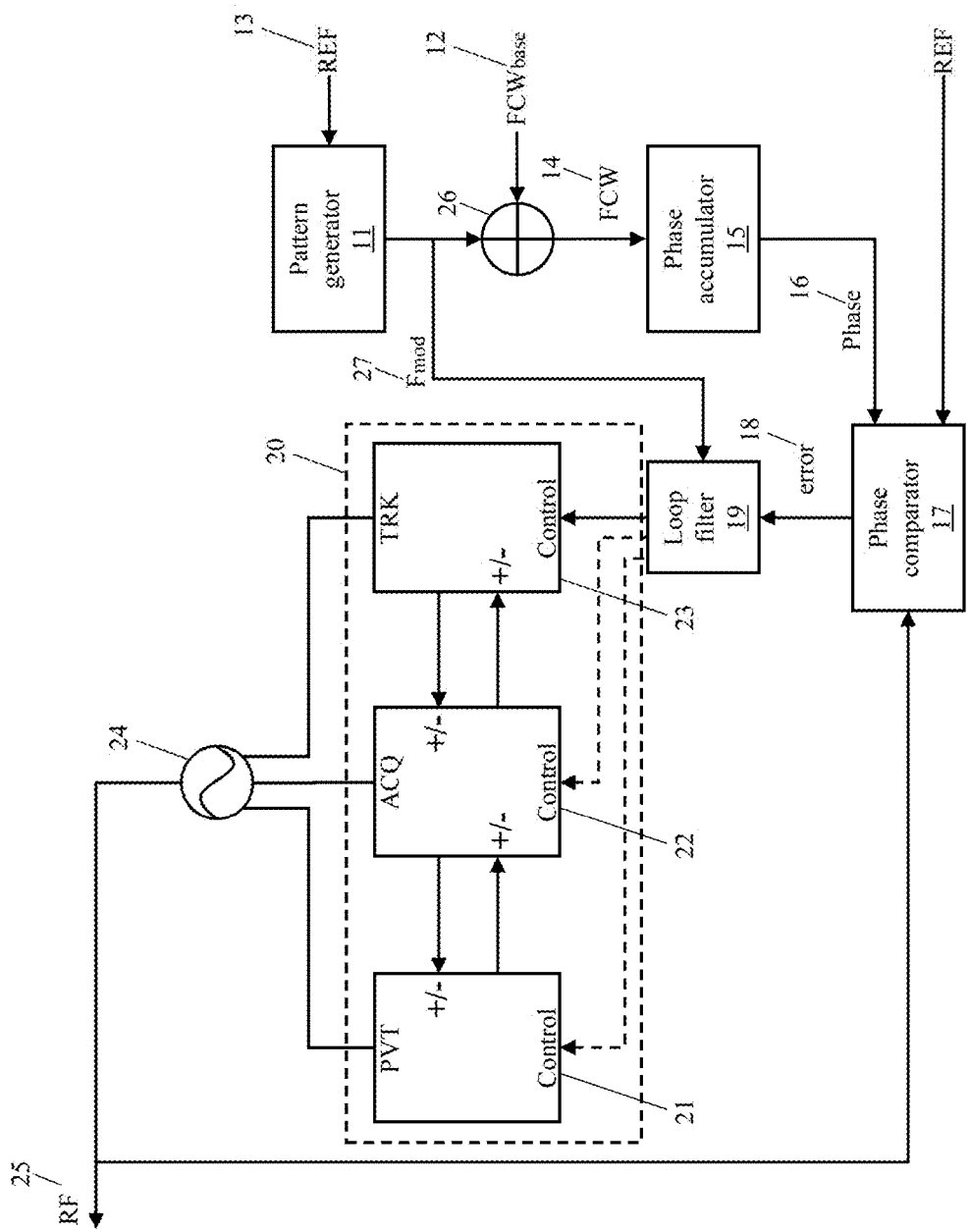
FIG. 1 shows a first example embodiment of the ADPLL according to the first aspect of the disclosure.

In FIG. 1, a first example embodiment of the ADPLL 10 according to the first aspect of the disclosure is illustrated. The inputs to the ADPLL 10 comprise a system clock 13 and a predefined setting 12 for the FCW to be generated. The output of the ADPLL 10 is an RF oscillation frequency 25, which is generated from a digitally controlled oscillator (DCO) 24 within the ADPLL 10. The system clock 13 is a high precision clock and can be generated from an external oscillator, for instance, a crystal-based oscillator, a microelectromechanical (MEMS) based oscillator and the like.

The ADPLL 10 comprises a pattern generator 11 that generates the FCW 14 based on the predefined setting 12 and the system clock 13. Since the system clock 13 is a high precision clock, it is therefore predictable and stable. Consequently, the generated pattern for the FCW 14 can be programmed accurately. The pattern for the FCW 14 can be a staircase, a stepped pyramid, a linear frequency sweep, a frequency-hopping pattern, and so on. A phase accumulator 15 translates the FCW 14 into a phase trajectory 16 by means of FM to PM translation, i.e., by calculating the phase position of a point in time on the waveform cycle. As such, the phase trajectory 16 is also predictable in nature.

A phase comparator 17 within the ADPLL 10 then performs a comparison between the phase trajectory 16 and the output oscillation frequency 25, thereby generating a phase error signal 18 when they differ from each other. Generally, the phase comparator 17 performs digital to time conversion, time to digital conversion and phase quantization in order to generate the phase error signal 18, where the system clock 13 is taken as the reference for performing digital to time conversion. Such conversions and quantization techniques are known in the art, and hence they are not described here in detail in order to avoid unnecessarily obscuring the disclosure.

A loop filter 19 is adapted to perform digital filtration of the phase error signal 18, representing an offset to the nominal FCW 14. Normally the offset is centralized at zero and is extended to positive and negative extremes resulting the required overflow and/or underflow, which are translated as control signals for controlling the DCO 24 frequency. The ADPLL 10 further comprises a controller 20 that utilizes the control signals from the loop filter 19 in order to address the required overflow and/or underflow. The controller 20 comprises a large PVT capacitor bank 21, a medium-sized ACQ capacitor bank 22 and a fine TRK capacitor bank 23.

In order to overcome bandwidth restricted phase/frequency modulation of the ADPLL 10, the present disclosure proposes a two-point modulation scheme. In some examples, at a first modulation point, a modulating data pattern or a modulating frequency or a modulating signal 27 from the pattern generator 11 is added via an adder 26 with the $FCW_{base}$ in order to generate the FCW 14.

$$FCW=F_{mod}+FCW_{base}$$

For example, the pattern generator 11 may generate the FCW 14 by modulating a channel FCW with a data FCW, where both FCW settings are predefined. The modulating signal 27 is further fed to the loop filter 19 through a direct path, where at a second modulation point, e.g., at the output of the loop filter 19, the modulating signal 27 is further utilized to modulate the loop filter 19 output. As such, the two-point modulation allows for a direct modulation of the DCO 24 while at the same time compensates the frequency reference and prevents the modulating data from affecting the phase error.

In a traditional digital PLL architecture, the PLL cannot go beyond the range of the TRK bank 23, i.e., only the TRK bank 23 can be changed when the PLL is locked and the PVT bank 21 and the ACQ bank 22 remain static. In order to extend the effective range of the proposed ADPLL 10, the controller 20 is adapted to exchange capacitance between the PVT bank 21 and the ACQ bank 22 as well as between the ACQ bank 22 and the TRK bank 23. In other words, the control codes for the DCO control banks 21,22,23 are exchangeable. For instance, the required overflow and/or underflow can be addressed effectively by exchanging capacitance from the TRK bank 23 to the ACQ bank 22, and further from the ACQ bank 22 to the PVT bank 21. Hence, a sticky-lock mechanism is facilitated for maintaining a sticky-lock overflow and/or underflow between the DCO control banks 21,22,23.

The sticky-lock mechanism is performed especially to carter for the programmed pattern that is likely to have a frequency span, which is multiples of the TRK bank 23 range. Moreover, the mechanism is performed in such a way that the ADPLL 10 maintains phase lock during capacitance exchange. In some examples, during the switchover, the ADPLL 10 is put on hold for the clock cycles used to switch to take care of any analog switching spikes in the DCO 24. The ADPLL 10 is put on hold by fixing the phase comparator 17 output, especially the time to digital conversion output to zero for the clock cycles responsible for the capacitance exchange.

As a result, the ADPLL can be locked over a larger band of sweep, for instance, over the entire ISM band sweep without a relock. This vastly increases the useful range without adding additional hardware in the DCO 24. Additionally or alternatively, the DCO 24 can be supported by a dedicated DCO control bank, for instance, a modulation bank that corresponds to the frequency span of all relevant RF channels. Although the implementation of the dedicated DCO bank allows for comprehensive control of the DCO 24 frequency, it also arises the necessity for additional hardware implementation in the DCO 24. It is further possible to externally initiate a relock command to the ADPLL 10, for instance, to the loop filter 19, in order to force the ADPLL 10 to relock to the phase trajectory 16 after changing the FCW 14 for changing the channel.

Figure 2:
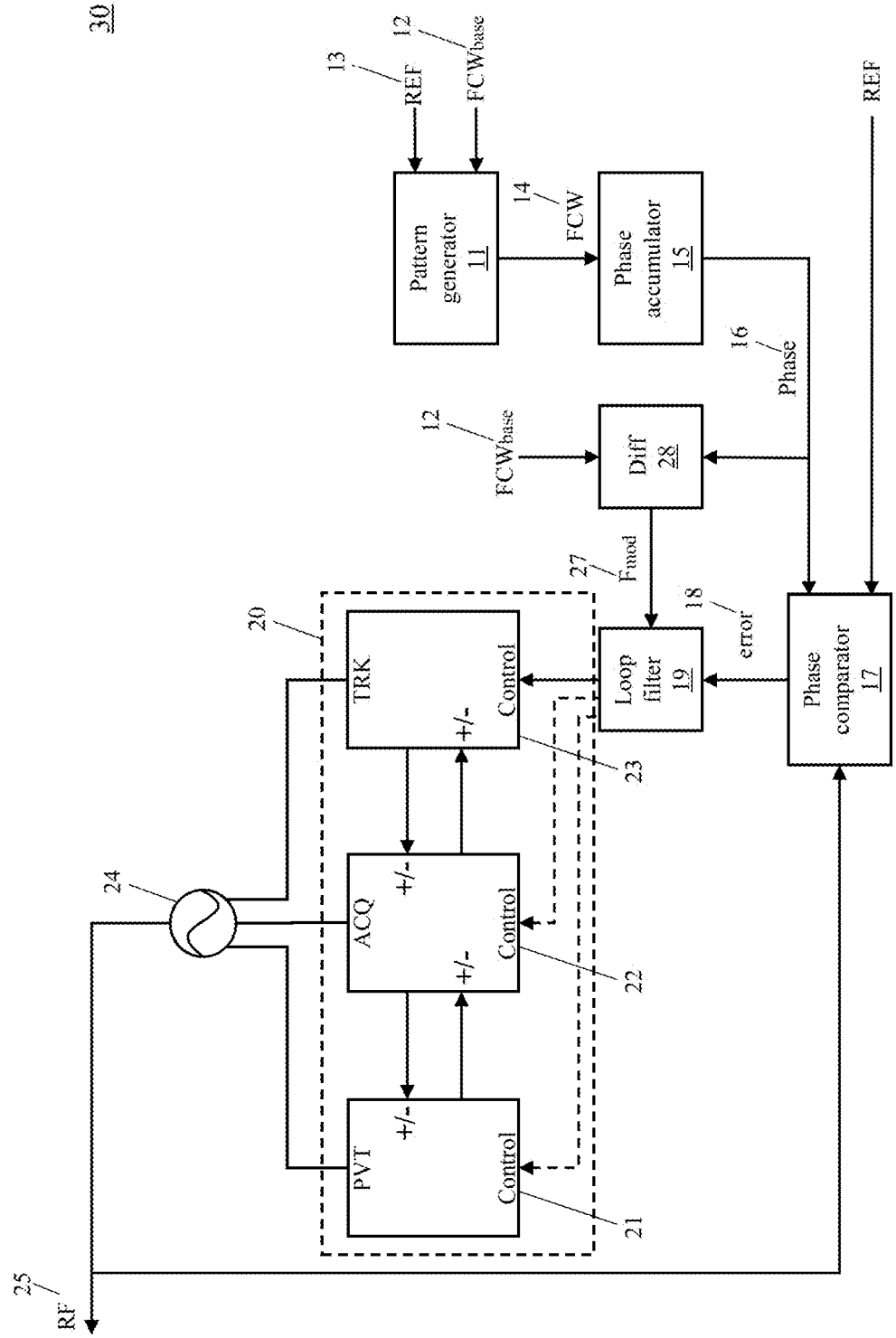
FIG. 2 shows a second example embodiment of the ADPLL according to the first aspect of the disclosure.

In FIG. 2, a second example embodiment of the ADPLL 30 according to the first aspect of the disclosure is illustrated. The ADPLL 30 differs from the ADPLL 10 of FIG. 1 in that the ADPLL 30 indirectly generates the modulating signal 27 in order to facilitate the two-point modulation scheme. In this context, the ADPLL 30 comprises a differentiator 28 coupled to the output path of the phase accumulator 15. The differentiator 28 performs a reverse operation of the phase accumulator 15, thereby reconstructing the FCW 14 from the phase trajectory 16. The predefined setting $FCW_{base}$ 12 at the first modulation point, e.g., at the input of the phase accumulator 15 (not explicitly shown), is also fed to the differentiator 28. Hence, the differentiator 28 is able to reconstruct the modulating signal 27 by subtracting $FCW_{base}$ 12 from the reconstructed FCW 14 in order to modulate the DCO 24 directly by modulating the output of the loop filter 19 at the second modulation point. Such a modulation scheme considerably speeds up the adaptation of the ADPLL to the desired phase trajectory as well as significantly increases the speed with which the channel switching is performed.

Along FIG. 3A and FIG. 3B, traditional output frequency control in a digital PLL are illustrated. In particular, FIG. 3A shows a traditional capacitance allocation scheme with an increased target frequency. The numbers in boxes right to the designated DCO control banks corresponds to the total number of capacitors available at each bank. The further numbers to the right represents the number of capacitors utilized at each time instant for the respective DCO banks. The output frequency is determined by the total amount of used capacitance. This total capacitance can be constructed from the total amount of available capacitance. Traditional digital PLLs, one in lock, only use the TRK bank capacitances to track the target frequency.

For instance, the PVT bank comprises 6 capacitors, the ACQ bank comprises 8 capacitors and the TRK bank comprises 12 capacitors. Upon initiating the tracking of the target sweep, consider that the PVT bank uses 1 capacitor of its 6 capacitors, the ACQ bank uses 5 capacitors of its 8 capacitors and the TRK bank uses 7 capacitors of its 12 capacitors. Since the traditional PLL can only change the TRK bank capacitance usage while being locked, with an increasing target frequency sweep would cause an error when the TRK bank reaches to its maximum range. Hence, the PLL will not maintain its locked state for the entire sweep and is can be relocked upon reaching the maximum range of the TRK bank.

Similarly, in FIG. 3B, the traditional capacitance allocation scheme is illustrated for a decreasing target frequency. Upon initiating the tracking, consider that the PVT bank uses 3 capacitors of its 6 capacitors, the ACQ bank uses 2 capacitors of its 8 capacitors and the TRK bank uses 4 capacitors of its 12 capacitors. However, when the variation of the decreasing target sweep is large, it causes an error even the TRK bank capacitance is decreased to zero. Hence, a traditional digital PLL that cannot go beyond the range of the TRK bank would fail to address the variation of the target frequency if it is too large.

Figures 4A, 4B:
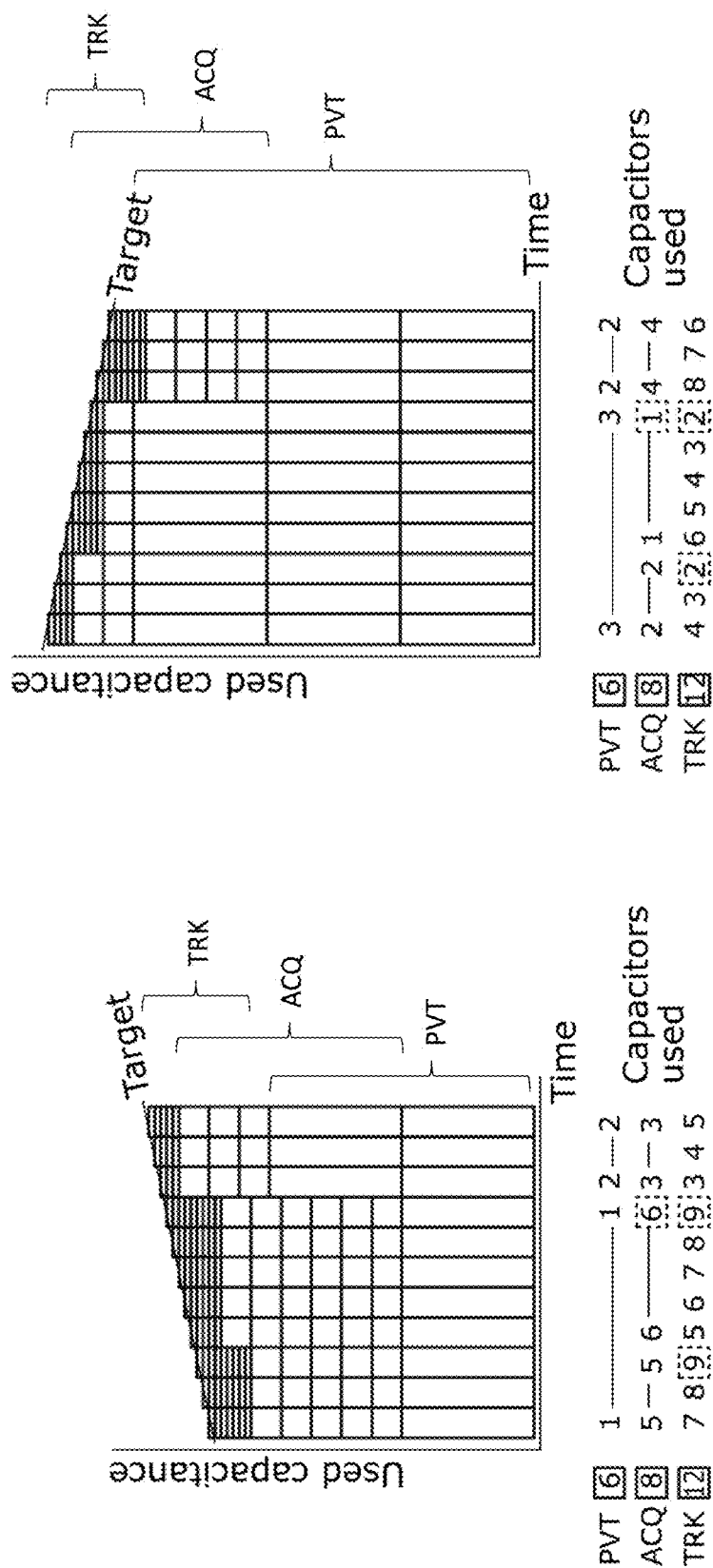
FIG. 4A shows the proposed capacitance allocation scheme with increasing target frequency by way of an example.
FIG. 4B shows the proposed capacitance allocation scheme with decreasing target frequency by way of an example.

Along FIG. 4A and FIG. 4B, the proposed capacitance allocation scheme for the ADPLL 10 are illustrated. Particularly, FIG. 4A shows the proposed capacitance allocation scheme for an increased target frequency. In an analogous manner illustrated in FIG. 3A, the numbers in boxes right to the designated DCO control banks corresponds to the total number of capacitors available at each bank. The further numbers to the right represents the number of capacitors utilized at each time instant for the respective DCO banks. As such, the PVT bank 21 comprises 6 large-sized sized capacitors, the ACQ bank 22 comprises 8 medium-sized capacitors and the TRK bank 23 comprises 12 fine capacitors. It is further considered that one PVT bank 21 capacitor value approximately corresponds to the cumulative value for 3 ACQ bank 22 capacitors and one ACQ bank 22 capacitor value approximately corresponds to the cumulative value for 4 TRK bank 23 capacitors.

Upon initiating the tracking of the target sweep, consider that the PVT bank 21 uses 1 capacitor of its 6 capacitors, the ACQ bank 22 uses 5 capacitors of its 8 capacitors and the TRK bank 23 uses 7 capacitors of its 12 capacitors. While tracking the increased target frequency, the amount of available capacitors in the TRK bank 23 is increased until reaching a specified limit, herein illustrated as 9 in terms of total number of used capacitors. Upon reaching the specified limit for the TRK bank 23, one capacitor of the ACQ bank 22 is added leading to 6 ACQ bank 22 capacitors in use, while the same amount of capacitance is subtracted, i.e., 4 TRK bank 23 capacitors, from the used TRK bank 23 capacitors to arrive at the same total capacitance.

Further into target tracking, not only the TRK bank 23 is set to a specified limit but also the ACQ bank 22, e.g., 6 in terms of total number of used capacitors. In case the ACQ bank 22 reaches its limit as well as the TRK bank 23 (6 and 9 respectively), one capacitor of the PVT bank 21 is added leading to 2 PVT bank 21 capacitors in use, while the same amount of capacitance is subtracted from the used ACQ bank 22 and the TRK bank 23 capacitors to arrive at the same total capacitance. Hence, the useful range of the target tracking is effectively increased. Therefore, the proposed disclosure uses all capacitor banks, i.e., PVT bank 21, ACQ bank 22 and the TRK bank 23, to compose the target capacitance value in order to address the variation in the target frequency, even if it is too large.

Similarly, FIG. 4B shows the proposed capacitance allocation scheme for a decreasing target frequency. Upon initiating the tracking, consider that the PVT bank 21 uses 3 capacitors of its 6 capacitors, the ACQ bank 22 uses 2 capacitors of its 8 capacitors and the TRK bank 23 uses 4 capacitors of its 12 capacitors. While tracking the decreased target frequency, the amount of available capacitors in the TRK bank 23 is correspondingly decreased until reaching a specified limit, herein illustrated as 2 in terms of total number of used capacitors.

Upon reaching the specified limit for the TRK bank 23, one capacitor of the ACQ bank 22 is subtracted leading to 1 ACQ bank 22 capacitor in use, while the same amount of capacitance is added to the TRK bank 23 to arrive at the same total capacitance. Further into target tracking, not only the TRK bank 23 is set to a specified limit but also the ACQ bank 22, e.g., 1 in terms of total number of used capacitors. In case the ACQ bank 22 reaches its limit as well as the TRK bank 23 (1 and 2 respectively), one capacitor of the PVT bank 21 is subtracted leading to 2 PVT bank 21 capacitors in use, while the same amount of capacitance is added to the ACQ bank 22 and the TRK bank 23 respectively to arrive at the same total capacitance.

Figure 5:
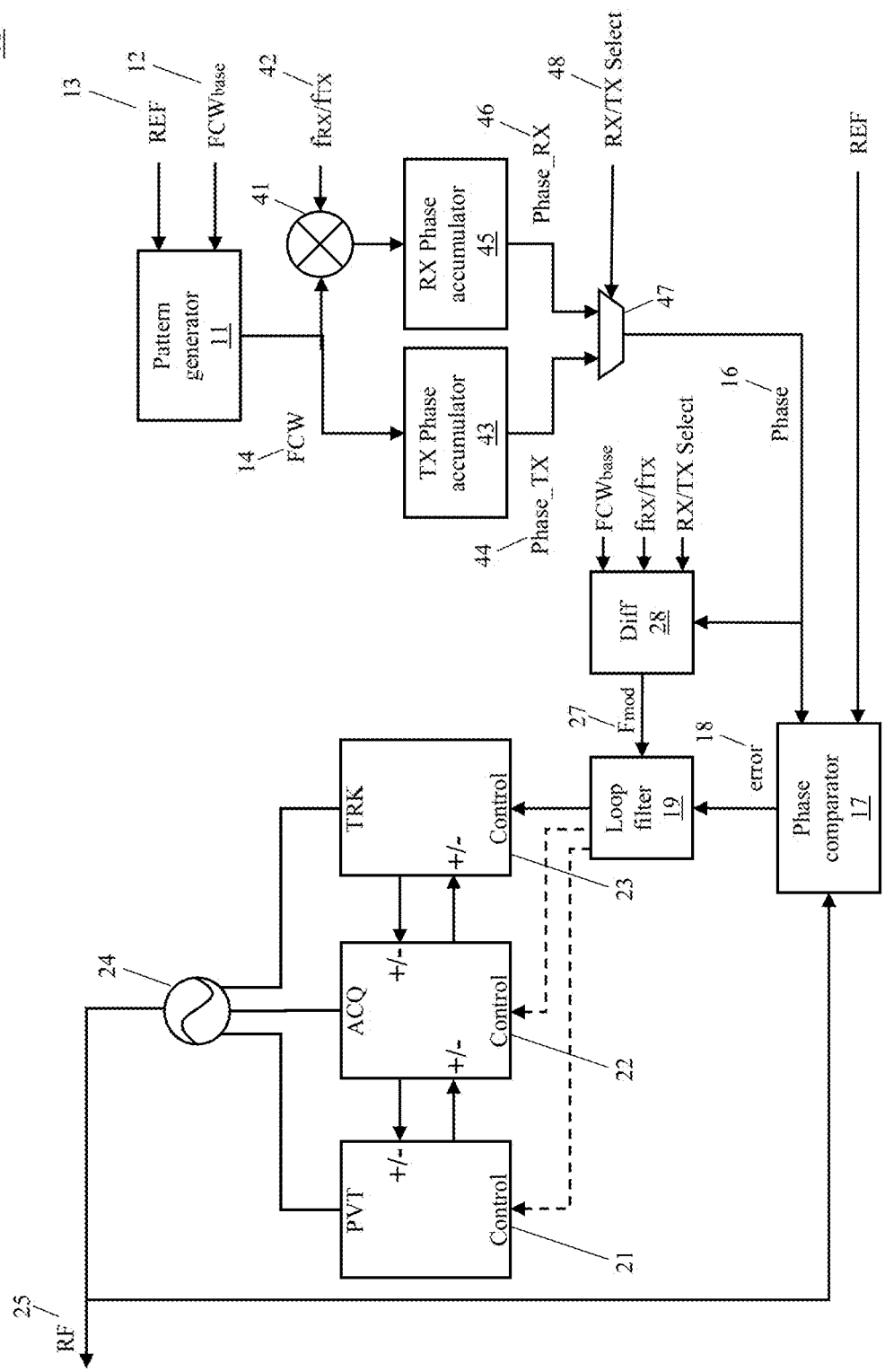
FIG. 5 shows a third example embodiment of the ADPLL according to the first aspect of the disclosure.

In FIG. 5, a second example embodiment of the ADPLL 40 according to the first aspect of the disclosure is illustrated. The ADPLL 40 is adapted to implement a predictable phase trajectory especially in the case where the frequency of the ADPLL 40 is different between receive mode RX and transmit mode TX. In this context, the FCW 14 to phase trajectory 16 translation scheme comprises a first phase accumulator 43, hereinafter referred to as TX phase accumulator 43, and a second phase accumulator 45, hereinafter referred to as RX phase accumulator 45. The TX phase accumulator 43 translates the FCW 14 into a TX phase trajectory 44 by means of FM to PM translation.

On the other hand, the FCW 14 is further multiplied with a specific modulation index or $f_{RX}/f_{TX}$ ratio 42 at a multiplier 41, and then is translated into a RX phase trajectory 46 by the RX phase accumulator 45 through FM to PM translation. The TX phase trajectory 44 and the RX phase trajectory 46 are switchable and are controlled through a switching means 47, which is operated externally via a RX/TX control 48 based on the mode of operation. In any case, the TX phase trajectory 44 corresponds to the predictable phase trajectory 16 when the ADPLL 40 is operating on transmit mode. Analogously, the RX phase trajectory 46 corresponds to the predictable phase trajectory 16 when the ADPLL 40 is operating on receive mode.

In order to facilitate the two-point modulation scheme, the ADPLL 40 also generates the modulating signal 27 indirectly in the manner described for ADPLL 30. Further to address the frequency difference between the receive mode RX and transmit mode TX, $FCW_{base}$ 12, $f_{RX}/f_{TX}$ 42 and RX/TX control 48 signals are additionally fed to the differentiator 28. By means of the control signals 42, 48 and the $FCW_{base}$ 12, the differentiator 28 is able to calculate the modulating signal 27 from the reconstructed FCW 14, thereby performing the modulation of the DCO 24 by modulating the output of the loop filter 19 at the second modulation point. Such a technique of subtracting a constant value after the differentiation function results in a simplified scheme to indirectly generate the modulating signal 27 in order to facilitate the two-point modulation scheme.

Figure 6:
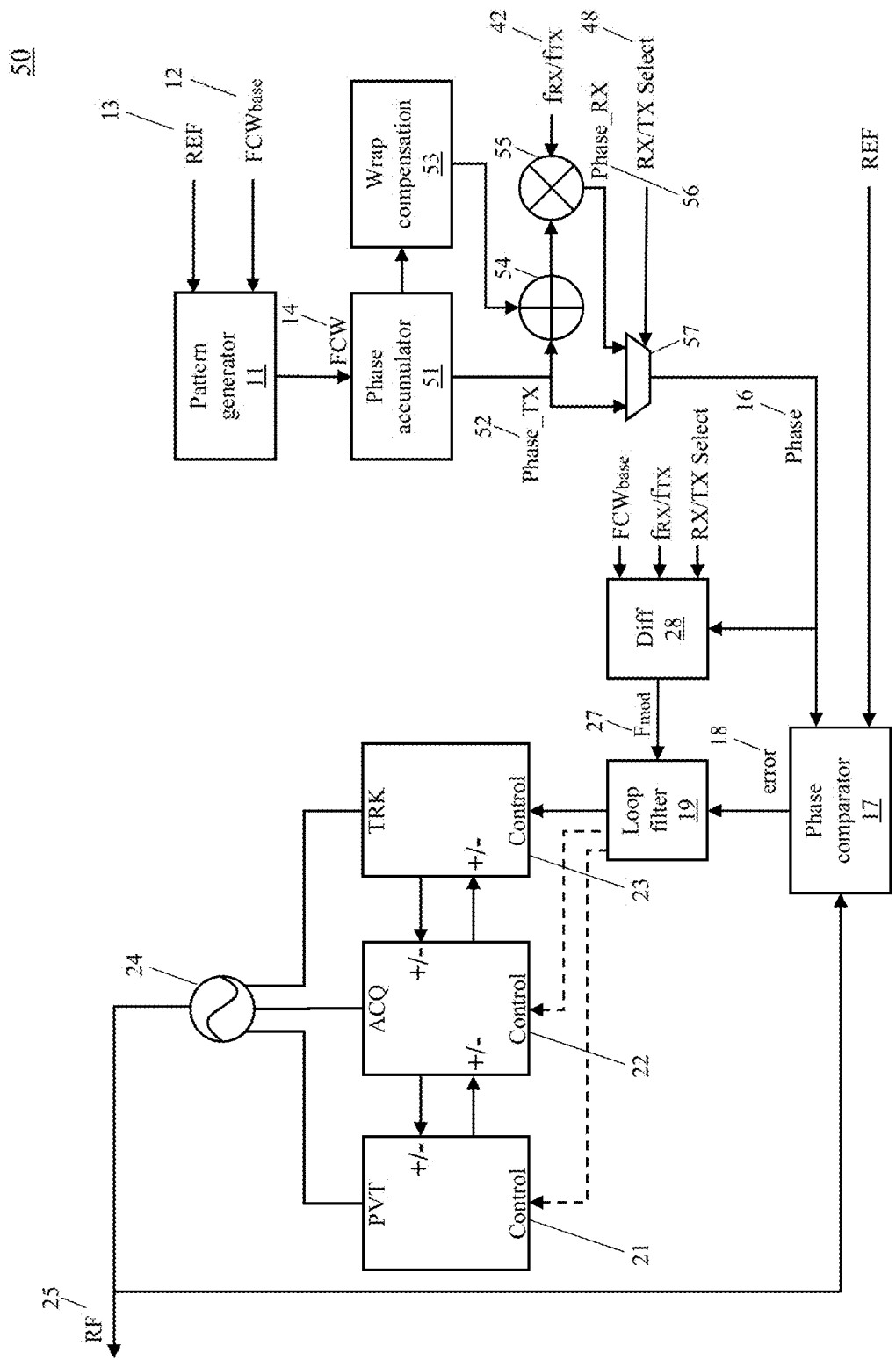
FIG. 6 shows a fourth example embodiment of the ADPLL according to the first aspect of the disclosure.

In FIG. 6, a third example embodiment of the ADPLL 50 according to the first aspect of the disclosure is illustrated. The ADPLL 50 differs from the ADPLL 40 of FIG. 5 in that the ADPLL 50 is adapted to generate a predictable phase trajectory for different TX and Rx frequency by means of a single phase accumulator. In this context, the FCW 14 to phase trajectory 16 translation scheme comprises a phase accumulator 51, which can be the same phase accumulator 15 illustrated in FIG. 1 for the ADPLL 10. The phase accumulator 51 translates the FCW 14 into a phase trajectory 52, e.g., TX phase trajectory, specific to the frequency defined for the transmit mode.

In order to generate the phase trajectory specific to the frequency defined for the receive mode, the phase accumulator 51 is associated with a compensation unit 53, which performs wrap compensation on the phase accumulator 51. The compensated output and the phase accumulator 51 output, i.e., TX phase trajectory 52, are added through an adder 54 and the result is then multiplied with the specific modulation index or $f_{RX}/f_{TX}$ ratio 42 at a multiplier 55, thereby outputting the RX phase trajectory 56. The sequence of the addition, i.e., the adder 54, and the multiplication, i.e., the multiplier 55, can be swapped.

The TX phase trajectory 52 and the RX phase trajectory 56 are switchable and are controlled through a switching means 57, which is operated externally via the RX/TX control 48 based on the mode of operation. In any case, the TX phase trajectory 52 corresponds to the predictable phase trajectory 16 when the ADPLL 50 is operating on transmit mode. Analogously, the RX phase trajectory 56 corresponds to the predictable phase trajectory 16 when the ADPLL 50 is operating on receive mode.

Therefore, when switching from receive mode to transmit mode and vice versa, the hypothetical phase trajectory of the ADPLL 40 resp. the ADPLL 50 if it would remain in receive or transmit mode should be stored. In this manner, the ADPLL 40 resp. the ADPLL 50 can lock to that trajectory to switch back from transmit mode to receive mode or vice versa. This can be stored in the second phase accumulator in the case of ADPLL 40 or can be calculated from a single phase accumulator in the case of ADPLL 50. As such, the proposed disclosure facilitates generation and implementation of a predictable phase trajectory even when the TX and RX frequency are not identical.

Figure 7:
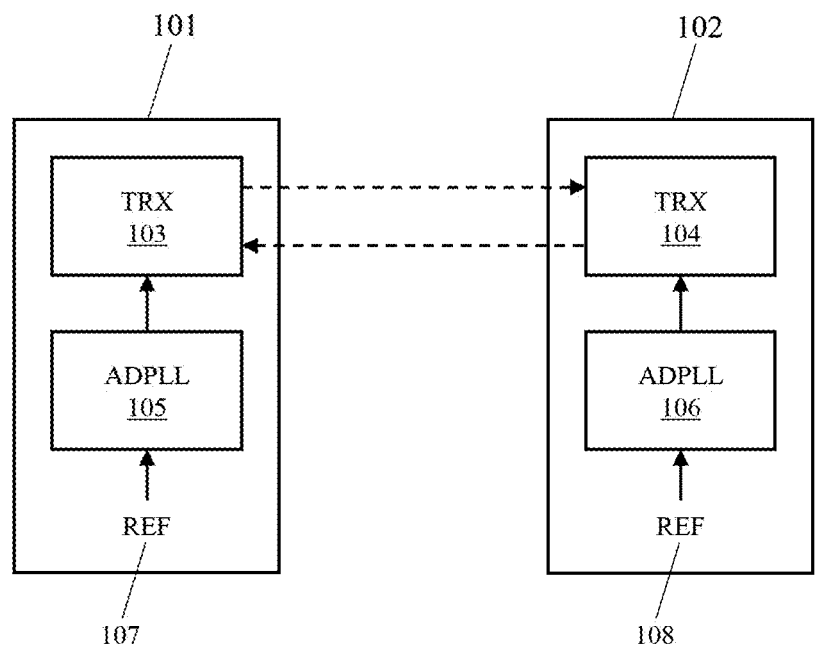
FIG. 7 shows an example embodiment of the system according to the second aspect of the disclosure.

In FIG. 7, an example embodiment of the system 100 according to the second aspect of the disclosure is illustrated. The system 100 comprises a first radio node 101 and a second radio node 102, and in some examples communicating with each other wirelessly in a half-duplex manner. The first radio node 101 comprises a transceiver 103 followed by an ADPLL 105, with the reference generated from a high precision system clock 107. Similarly, the second radio node 102 comprises a transceiver 104 followed by an ADPLL 106, with the reference generated from a high precision system clock 108.

Each node 101,102 is operable on a transmit mode and/or a receive mode, where the mode of operation for each node 101,102 is switchable over the number of channels to be measured. The ADPLLs 105,106 may be the ADPLL 10 or ADPLL 30 as illustrated in FIG. 1 and FIG. 2 respectively, especially in the case where the frequency of the ADPLLs 105,106 are identical for transmit mode and for receive mode. Additionally or alternately, the ADPLLs 105,106 can be any of the ADPLL 40 or ADPLL 50 respectively illustrated in FIG. 5 and FIG. 6, especially in the case where the frequency of the ADPLLs 105,106 are different for transmit mode and for receive mode.

During a ranging procedure, the first radio node 101 operates as an initiator and the second radio node 102 operates as a reflector or vice versa. The respective ADPLLs 105,106 generate a radio frequency each from their own reference frequency. While in receiving mode, the radio frequency is used by the nodes 101,102 to receive an RF signal. Analogously, while in transmit mode, the radio frequency is used by the nodes 101,102 to transmit an RF signal.

In a traditional ranging procedure, especially when switching between channels, there is a random phase relation between the PLL output signals for each channel. Hence, there is no phase-coherency when switching between channels. As a result, both measuring nodes step through multiple channels to measure the phase at each channel. In each channel, first one node acts as a transmitter and the other node acts as a receiver while a phase measurement is performed. After that, the roles are swapped and a second phase measurement is performed. Thus, for ranging over N number of channels, at least N number of TX/RX switches are necessary.

By implementing a predictable phase trajectory for both transmit mode and receive mode, the unpredictability for switching is significantly minimized. Moreover, the phase trajectory is predictable in both timing and in amplitude over the number of channels to be measured. This effectively reduces the time required to perform the whole ranging measurement, thereby reducing the overall energy consumption and further increases the update rate. Since, the ADPLLs 105,106 are forced to follow a predictable phase trajectory, phase based ranging can be achieved to be phase coherent over all channels of the ranging procedure. Therefore, the proposed disclosure reduces the number of TX/RX switches in extremes to only one instead of equal to the number of channels N.

Figure 8:
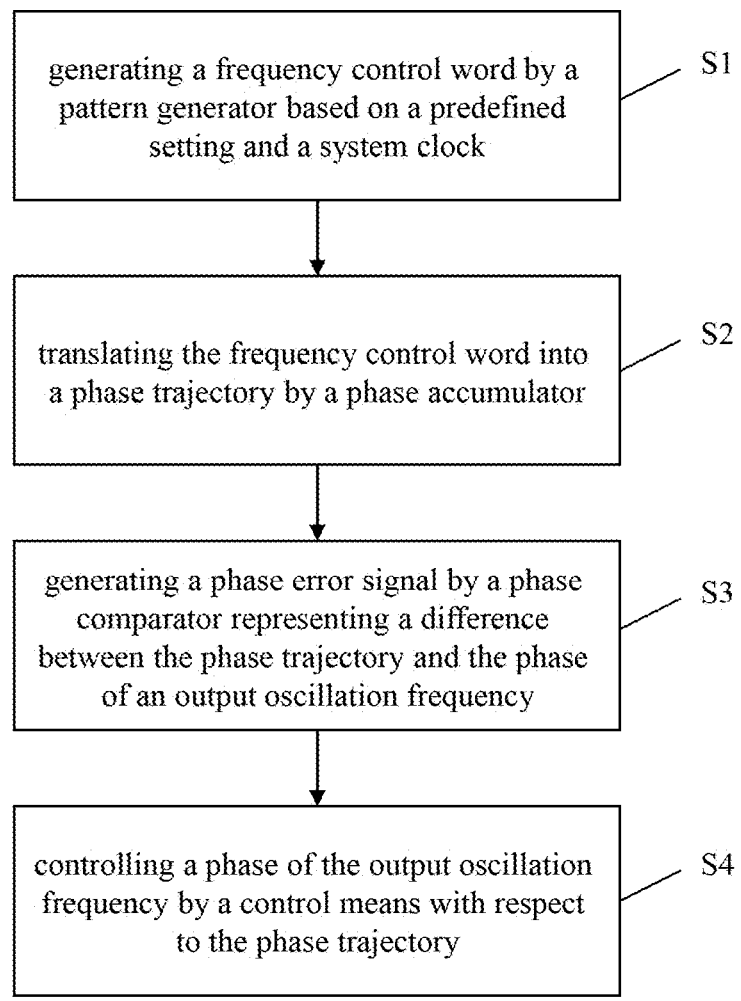
FIG. 8 shows an example embodiment of the method according to the third aspect of the disclosure.

In FIG. 8, an example embodiment of the method according to the third aspect of the disclosure is illustrated. In a first step S1, a frequency control word is generated by a pattern generator based on a predefined setting and a system clock.

In a second step S2, the frequency control word is translated into a phase trajectory by a phase accumulator. In a third step S3, a phase error signal is generated by a phase comparator representing a difference between the phase trajectory and the phase of an output oscillation frequency. Finally, in a fourth step S4, a phase of the output oscillation frequency is controlled with respect to the phase trajectory by a controller.

As mentioned earlier, the concatenation of narrow-band channels to virtual-wideband makes it possible for half-duplex low power radios to achieve a very high ranging accuracy. There are two reasons why it may be desirable to be phase coherent over all channels of the ranging procedure. Firstly, due to multipath in non-line of sight channels, ambiguity in the virtual-wideband channel phase state information occurs when channels are concatenated. Secondly, the time it takes to do the ranging measurement may be as short as possible to reduce energy consumption and/or increase update rate. The present disclosure warrants that the phase trajectory 16 that the ADPLL 10 follows is predictable in both timing and amplitude. Furthermore, the ADPLL 10 is forced to follow this phase trajectory 16 in a continuously on mode by a dedicated DCO control bank, or by exchanging control codes over existing DCO control banks 21,22,23, or by forcing the ADPLL 10 to lock to the desired phase trajectory 16 over multiple separate locks of the ADPLL 10.

The embodiments of the present disclosure can be implemented by hardware, software, or any combination thereof. Various embodiments of the present disclosure may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired for any given or particular application.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. An all-digital phase locked loop comprising:
   a pattern generator configured to generate a frequency control word based on a predefined setting and a system clock;
   a phase accumulator configured to translate the frequency control word into a phase trajectory;
   a phase comparator configured to generate a phase error signal representing a difference between the phase trajectory and a phase of an output oscillation frequency;
   a controller configured to control the phase of the output oscillation frequency with respect to the phase trajectory; and
   a loop filter adapted to generate control signals towards the controller based on the phase error signal and a modulating signal calculated from the phase trajectory.

2. The all-digital phase locked loop according to claim 1, further comprising:
   a differentiator adapted to calculate the modulating signal from the phase trajectory.

3. The all-digital phase locked loop according to claim 1, wherein the controller comprises a Process-Voltage-Temperature capacitor bank, an Acquisition capacitor bank, and a Tracking capacitor bank, and wherein the controller is further adapted to exchange capacitance between the Process-Voltage-Temperature capacitor bank and the Acquisition capacitor bank, and between the Acquisition capacitor bank and the Tracking capacitor bank in order to increase their effective range.

4. The all-digital phase locked loop according to claim 1, wherein the phase trajectory translated from the frequency control word is predictable in both timing and amplitude over a number of channels to be measured.

5. The all-digital phase locked loop according to claim 4, wherein the phase accumulator is further adapted to receive a relock command in order to relock the all-digital phase locked loop to the phase trajectory when switching over the number of channels to be measured.

6. The all-digital phase locked loop according to claim 4, wherein the controller comprises a modulation bank respecting a frequency span of the number of channels to be measured.

7. The all-digital phase locked loop according to claim 1, wherein the phase accumulator further comprises a first phase accumulator and a second phase accumulator respectively operable on a transmit mode and a receive mode or vice versa.

8. The all-digital phase locked loop according to claim 1, wherein the phase accumulator further comprises a compensation unit adapted to calculate a respective phase trajectory for a transmit mode or a receive mode.

9. A wireless communication system comprising a first radio node and a second radio node, each comprising the all-digital phase locked loop of claim 1, wherein the first radio node is operable on a transmit mode and the second radio node is operable on a receive mode or vice versa.

10. The wireless communication system according to claim 9, wherein the first radio node and the second radio node are adapted to switch between the transmit mode and the receive mode through a number of channels to be measured in order to measure a phase at each channel.

11. A method for maintaining phase lock of an all-digital phase locked loop along a predictable phase trajectory, the method comprising:
    generating a frequency control word by a pattern generator based on a predefined setting and a system clock;

translating the frequency control word into a phase trajectory by a phase accumulator;
generating a phase error signal by a phase comparator representing a difference between the phase trajectory and a phase of an output oscillation frequency; and
controlling the phase of the output oscillation frequency by a controller with respect to the phase trajectory, and generating, by a loop filter, control signals towards the controller based on the phase error signal and a modulating signal calculated from the phase trajectory.

12. The method according to claim 11, wherein the method further comprises:
calculating, by a differentiator, the modulating signal from the phase trajectory.

13. The method according to claim 11,
wherein the controller comprises a Process-Voltage-Temperature capacitor bank, an Acquisition capacitor bank, and a Tracking capacitor bank, and
wherein the method further comprises a step of exchanging capacitance between the Process-Voltage-Temperature capacitor bank and the Acquisition capacitor bank, and between the Acquisition capacitor bank and the Tracking capacitor bank by the controller, thereby increasing their effective range.

14. The method according to claim 13, wherein the method further comprises:
setting an output of the phase comparator to zero in order to maintain a phase lock while exchanging capacitance.

15. The method according to any of claim 11, wherein the method further comprises:
translating the phase trajectory from the frequency control word in a predictable manner in both timing and amplitude over a number of channels to be measured.

16. The method according to claim 12, wherein:
the differentiator is coupled to an output path of the phase accumulator,
the method further comprises:
receiving the predefined setting at the differentiator,
performing, at the differentiator, a reverse operation of the phase accumulator to reconstruct the frequency control word from the phase trajectory, and
the differentiator calculates the modulating signal by subtracting the predefined setting from the reconstructed frequency control word.

17. The method according to claim 12, further comprising:
receiving, at the differentiator, a modulation index and a receive-mode/transmit-mode control signal,
wherein calculating the modulating signal is based on the modulation index and the receive-mode/transmit-mode control signal.

18. The all-digital phase locked loop according to claim 2, wherein:
the differentiator is coupled to an output path of the phase accumulator,
the differentiator is adapted to receive the predefined setting and to perform a reverse operation of the phase accumulator to reconstruct the frequency control word from the phase trajectory, and
the differentiator calculates the modulating signal by subtracting the predefined setting from the reconstructed frequency control word.

19. The all-digital phase locked loop according to claim 2, wherein:
the differentiator is adapted to receive a modulation index and a receive-mode/transmit-mode control signal, and
calculating the modulating signal is based on the modulation index and the receive-mode/transmit-mode control signal.

* * * * *